(12) United States Patent
Kuo

(10) Patent No.: US 7,554,851 B2
(45) Date of Patent: Jun. 30, 2009

(54) RESET METHOD OF NON-VOLATILE MEMORY

(75) Inventor: Ming-Chang Kuo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 171 days.

(21) Appl. No.: 11/620,450

(22) Filed: Jan. 5, 2007

(65) Prior Publication Data

US 2008/0165588 A1  Jul. 10, 2008

(51) Int. Cl.
*G11C 11/34* (2006.01)
*G11C 16/04* (2006.01)

(52) U.S. Cl. .......................... 365/185.24; 365/185.27; 365/185.28

(58) Field of Classification Search ............ 365/185.24, 365/185.27, 185.28
See application file for complete search history.

(56) References Cited

U.S. PATENT DOCUMENTS

| | | | |
|---|---|---|---|
| 6,011,725 A | 1/2000 | Eitan | |
| 6,690,601 B2 | 2/2004 | Yeh et al. | |
| 7,397,701 B2* | 7/2008 | Yeh et al. | 365/185.18 |
| 2004/0100826 A1 | 5/2004 | Cho | |
| 2005/0237801 A1* | 10/2005 | Shih | 365/185.11 |
| 2005/0270849 A1* | 12/2005 | Lue | 365/185.28 |
| 2007/0087482 A1* | 4/2007 | Yeh et al. | 438/120 |
| 2007/0133307 A1* | 6/2007 | Hsu et al. | 365/185.29 |
| 2008/0123418 A1* | 5/2008 | Widjaja | 365/185.08 |
| 2008/0151642 A1* | 6/2008 | Wu | 365/185.29 |

\* cited by examiner

*Primary Examiner*—Ly D Pham
(74) *Attorney, Agent, or Firm*—J.C. Patents

(57) ABSTRACT

A reset method of a non-volatile memory is described. The non-volatile memory includes a plurality of cells on a substrate of a first conductivity type, each including a portion of the substrate, a control gate, a charge-storing layer between the portion of the substrate and the control gate, and two S/D regions of a second conductivity type in the portion of the substrate. The reset method utilizes a DSB-BTBTHH effect. A first voltage is applied to the substrate and a second voltage to both S/D regions of each cell, wherein the difference between the first and second voltages is sufficient to cause band-to-band tunneling hot holes. A voltage applied to the control gate and the period of applying the voltages are controlled such that the threshold voltages of all the cells converge in a tolerable range.

11 Claims, 3 Drawing Sheets

RESET METHOD OF NON-VOLATILE MEMORY

BACKGROUND OF THE INVENTION

1. Field of the Invention

The present invention relates to an operating method of a semiconductor device, and more particularly to a reset method of non-volatile memory, which is implemented through a double-side bias band-to-band tunneling hot-hole ((DSB-BTBTHH) effect.

2. Description of Related Art

Electrically erasable programmable non-volatile memory, such as flash memory, is operated usually based on electron injection into a charge-storing layer and electron removal from the same. The electron removal operation is carried out by, for example, ejecting the electrons out of the charge-storing layer or injecting electric holes into the charge-storing layer to combine with the electrons.

Such a memory is operated mostly in one of the following two modes. In the first mode, the electrons in the charge-storing layers of all memory cells are removed for erasing, and electrons are injected into the charge-storing layers of a part of the cells for programming. In the second mode, electrons are injected into the charge-storing layers of all cells for erasing, and the electrons in the charge-storing layers of a part of the cells are removed for programming.

Because the erasing is performed to all cells in the above two modes, the cells preset to the erased state before the erasing are over-erased in the erasing. Thus, for a non-volatile memory operated in the first mode, a certain amount of positive charges exists in the charge-storing layers of a part of the cells after a certain number of the programming/erasing cycles, which results in a leakage issue. On the other hand, for a non-volatile memory operated in the second mode, excess electrons are stored in the charge-storing layers of a part of the cells after a certain number of the programming/erasing cycles, which leads to overly high threshold voltages. Hence, reading/writing error tends to take place in subsequent use of the non-volatile memory device.

To solve said issue, a reset operation is required after the non-volatile memory is used for certain time to make all the memory cells have similar threshold voltages. A conventional reset method is usually performed making the threshold voltages of all the cells around the predetermined threshold voltage of the high-Vt state or the low-Vt state. However, with such a reset method, the variation between the threshold voltages of all the cells is not small enough so that the possibility of reading/writing error cannot be effectively reduced.

SUMMARY OF THE INVENTION

In view of the foregoing, the present invention provides a reset method of a non-volatile memory, which is implemented through a DSB-BTBTHH effect.

A non-volatile memory to which the reset method of this invention is applicable includes a plurality of cells on a substrate of a first conductivity type, each including a portion of the substrate, a control gate, a charge-storing layer between the portion of the substrate and the control gate, and two source/drain (S/D) regions of a second conductivity type in the portion of the substrate. The charge-storing layer includes, for example, a floating gate, a charge-trapping layer or a nano-crystal layer. As the charge-storing layer includes a charge-trapping layer or nano-crystal layer, each cell may have two data storage regions adjacent to the two S/D regions, respectively. Moreover, the non-volatile memory may have a virtual ground array structure, for example.

The reset method of this invention utilizes a DSB-BT-BTHH effect. A first voltage is applied to the substrate and a second voltage to both S/D regions of each cell, wherein the difference between the first and second voltages is sufficient to cause band-to-band tunneling hot holes. A gate voltage applied to the control gate of each cell and the period of applying the voltages are controlled such that the threshold voltages of all the memory cells converge in a tolerable range.

In an embodiment of this invention, the gate voltage is equal to the first voltage. When the first conductivity type is P-type and the second conductivity type is N-type, the second voltage is higher than the first voltage. For example, the first voltage is 0V and the second voltage ranges from 5V to 7V.

In another embodiment of this invention, the gate voltage includes a third voltage and a fourth voltage that are alternatively applied to the control gate, wherein the third voltage is higher than the first voltage but the fourth voltage lower than the first voltage. It is preferred that the difference between the first and third voltages is equal to that between the first and fourth voltages and the duration of each application of the third voltage is equal to that of each application of the fourth voltage. For example, the first voltage is 0V, the third voltage ranges from 5V to 7V, and the fourth voltage ranges from −5V to −7V.

Unlike the conventional reset method that sets the threshold voltages of all cells around the predetermined threshold voltage of the high-Vt state or the low-Vt state, the reset method of this invention enables the threshold voltages of all cells to converge in a certain range between the predetermined threshold voltages of the high-Vt state and the low-Vt state. By adjusting the period of applying the reset method, the Vt-distribution obtained with this invention can be narrower than that obtained with the conventional reset method. Therefore, the possibility of data writing/reading error is reduced in the subsequent use of the non-volatile memory.

It is to be understood that both the foregoing general description and the following detailed description are exemplary, and are intended to provide further explanation of the invention as claimed.

DESCRIPTION OF EMBODIMENTS

It is firstly noted that though the following embodiments only describe a case where the first conductivity type is P-type and the second conductivity type is N-type, one of ordinary skill in the art can understand, based on the following descriptions, that the method of this invention is also applicable to the cases where the first conductivity type is N-type and the second conductivity type is P-type.

Moreover, the charge-storing layer in a non-volatile memory to which the reset method of this invention is applicable may be a floating gate, a charge-trapping layer or a nano-crystal layer, for example. The floating gate usually includes doped polysilicon, the charge-trapping layer usually includes silicon nitride, and the nano-crystal layer usually includes many nano-crystals of a conductor material in a dielectric layer. Although the following embodiments merely take a non-volatile memory with charge-trapping layers as an example, one of ordinary skill in the art can understand, based on the following descriptions, that this invention can also be applied to a non-volatile memory having floating gates or nano-crystal layers as charge-storing layers.

Furthermore, though the erasing operation of non-volatile memory described in the following embodiments removes electrons from the charge-storing layer, a non-volatile memory apparatus that injects electrons for erasing can also be reset with the reset method according to the first or the second embodiment of this invention.

Figure 1:
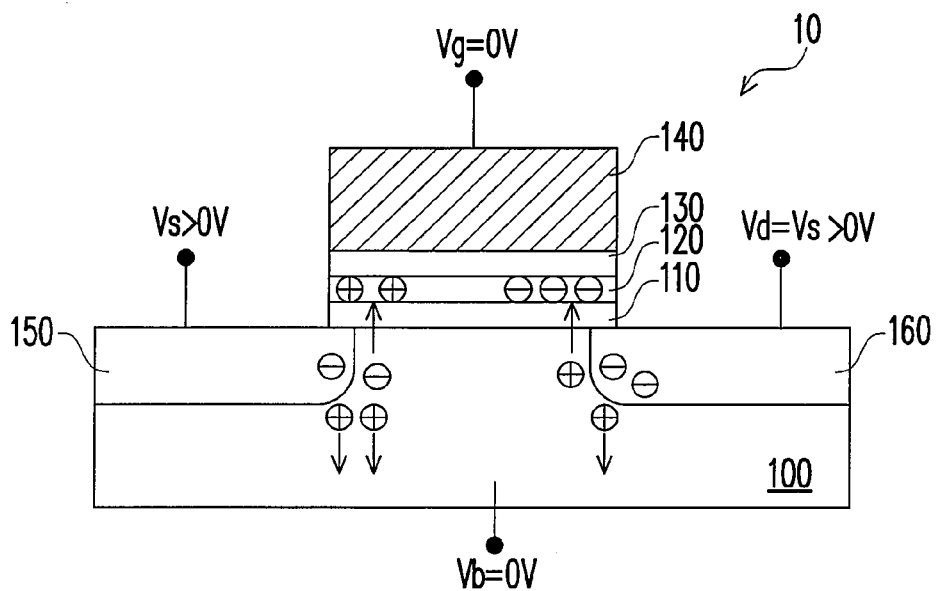
FIG. 1 shows the voltages applied to different parts of an exemplary memory cell and the resulting effect in a reset method of non-volatile memory according to the first embodiment of this invention.

FIG. 1 shows the voltages applied to different parts of an exemplary memory cell and the resulting effect in the reset method according to the first embodiment of this invention. The cell 10 includes a portion of a P-substrate 100, a bottom oxide layer 110, a nitride layer 120 as a charge-trapping layer, a top oxide layer 130 and a control gate 140 sequentially stacked on the portion of the substrate 100, and an N-type source region 150 and an N-type drain 160 in the substrate 100 beside the control gate 140. The memory cell 10 may have only one data storage region that is the entire region under the control gate 140 or have two data storage regions adjacent to the source region 150 and the drain region 160, respectively.

Moreover, one example of the non-volatile memory cell with a floating gate as the charge-storing layer is the one obtained by replacing the layers 110, 120 and 130 with a tunnel oxide layer, a polysilicon floating gate and an inter-gate dielectric layer, respectively. One example of the cell with a nano-crystal layer as the charge-storing layer is the one obtained by replacing the nitride layer 120 with an oxide layer having silicon nano-crystals therein. When the charge-storing layer is a nano-crystal layer, each cell may have two data storage regions adjacent to the source region 150 and the drain region 160, respectively, as in the case of the charge-trapping layer.

To simultaneously illustrate the change of a data storage region preset to a high-Vt storage state and that of an over-erased data storage region during the reset operation, the memory cell 10 in FIG. 1 has two data storage regions adjacent to the source region 150 and the drain region 160, respectively, wherein the left one has been over-erased so that the nitride layer 120 therein includes positive charges, and the right one is preset to a high-Vt state so that the nitride layer 120 therein includes negative charges.

Referring to FIG. 1, the reset method of this embodiment includes applying 0V to the control gate 140 and the substrate 100 and applying voltages Vs and Vd (=Vs) higher than 0V to the source region 150 and the drain region 160, respectively, wherein the voltage application to both S/D regions 150 and 160 is namely the double-side bias (DSB) application. Vs (=Vd) is high enough, for example, 5V to 7V, to cause band-to-band tunneling hot holes and thereby form electron/hole pairs in the substrate 100. The electrons are attracted by the positive charges in the nitride layer 120 in the left data storage region to enter the same and thus gradually raise the threshold voltage of the left data storage region. The electric holes are attracted by the negative charges in the nitride layer 120 in the right data storage region to enter the same and thus gradually lower the threshold voltage of the right data storage region. After a certain period of time, the charge amount in the nitride layer 120 in each of the data storage regions approaches a balanced value, such that the data storage regions have similar threshold voltages.

Hence, for other cells whose two data storage regions are not in the combination of over-erasing and high-Vt states but in the combination of two over-erasing states, two high-Vt states, two normally erased states, over-erased and normally erased states or high-Vt and normally erased states, their data storage regions can also have similar threshold voltages after the reset operation is performed for a certain period of time. In other words, the period of applying the voltages ought to be long enough to have the threshold voltages of all the memory cells converge in a tolerable range.

Besides, it is understood from the above that in a non-volatile memory having only one data storage region in each memory cell, the cells in the over-erased state, in the high-Vt state(s) and in the normally erased state can also have similar threshold voltages with the reset method according to the first embodiment of this invention.

Figure 2:
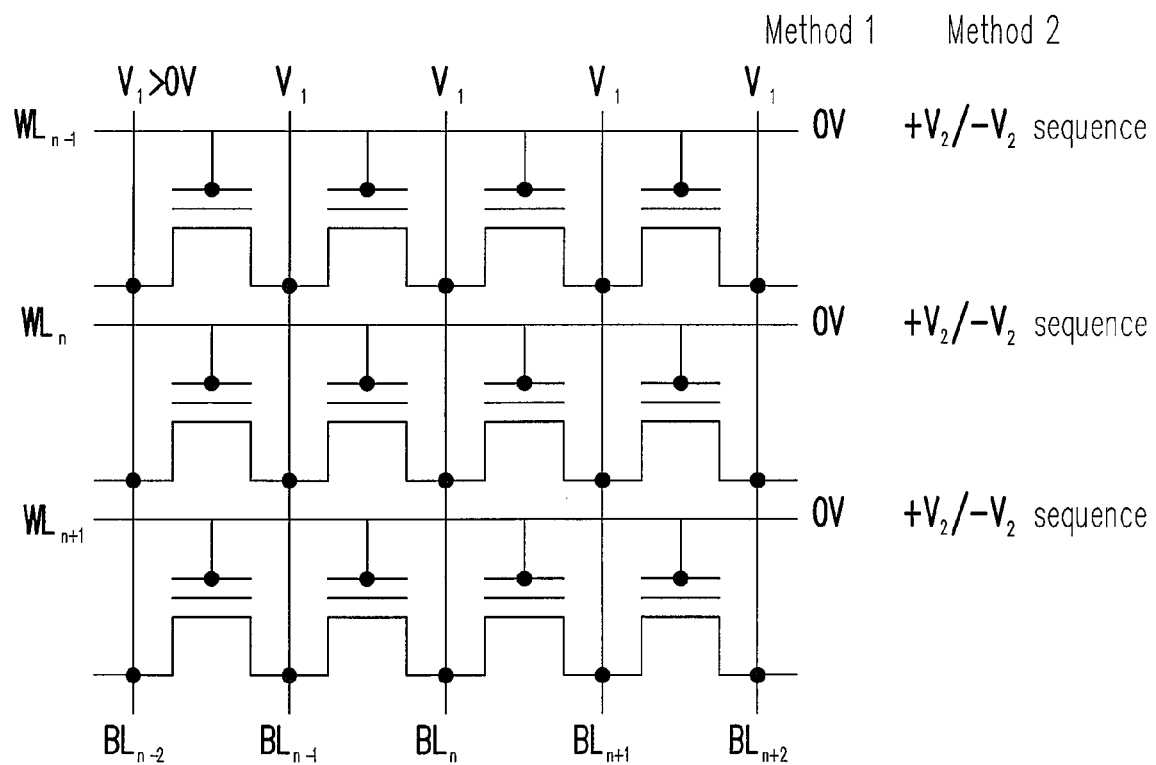
FIG. 2 depicts the reset methods of non-volatile memory in the first and second embodiments of this invention, wherein the non-volatile memory is represented by a circuit diagram.

An example of the above reset method is depicted in FIG. 2, wherein the non-volatile memory represented by a circuit diagram has a virtual ground array structure. In this example, the substrate and all of the word lines (WL) coupled to the control gates are applied with 0V, and all of the bit lines (BL) coupled to the S/D regions are applied with a voltage $V_1$ that is higher than 0V and is sufficiently high, possibly ranging from 5V to 7V, to cause band-to-band tunneling hot holes. The resulting effect in each memory cell has been described above.

Figure 3:
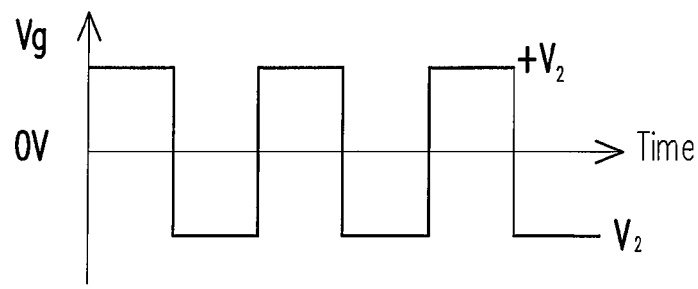
FIG. 3 shows the time-varying gate voltage (Vg) applied in the reset method according to the second embodiment of this invention.
Figure 4A:
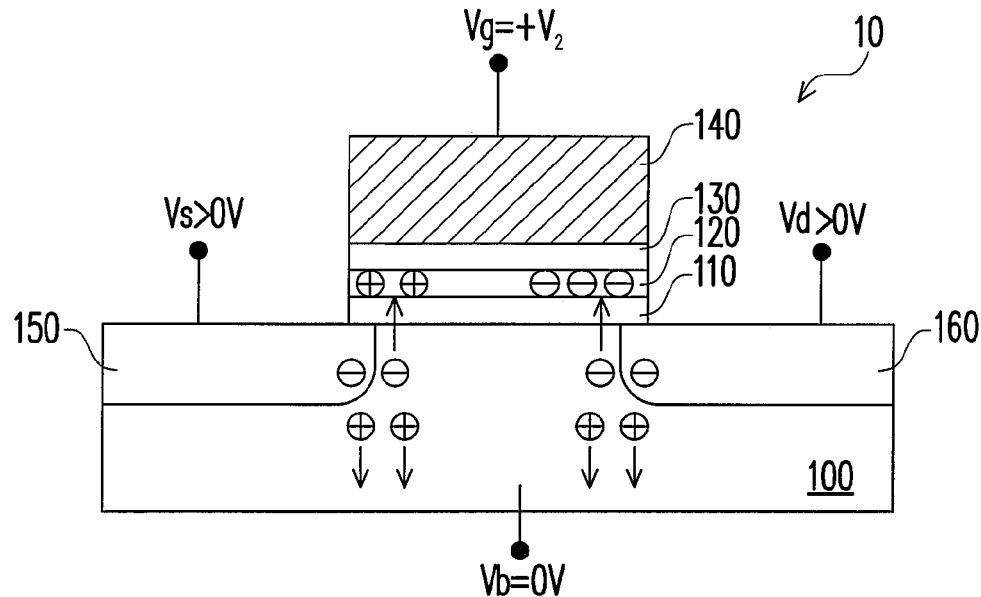
FIGS. 4A/4B shows the voltages applied to different parts of an exemplary cell and the resulting effect when the gate voltage is positive/negative in a reset method according to the second embodiment of this invention.
Figure 4B:
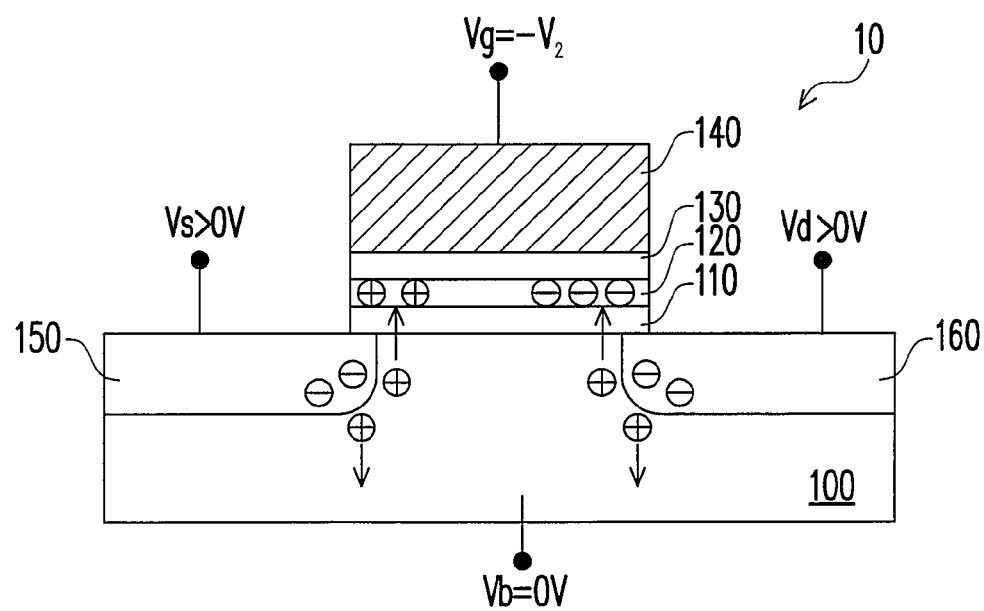

FIGS. 3, 4A and 4B depict a reset method of non-volatile memory according to the second embodiment of this invention. FIG. 3 shows the Vg-variation with time, while FIG. 4A/4B shows the voltages applied to different parts of an exemplary cell and the resulting effect when the gate voltage is positive/negative in the reset method of the second embodiment. The cell 10 in FIG. 4A/4B is the same as that in FIG. 1, and also has two data storage regions adjacent to the source region 150 and the drain region 160, respectively, wherein the left one has been over-erased and the right one is preset to a high-Vt state.

As shown in FIGS. 3, 4A and 4B, the substrate 100 is applied with 0V, the source region 150 and the drain region 160 are respectively applied with Vs and Vd (=Vs), and the control gate 140 of each cell 10 is applied with $+V_2$ higher than 0V and $-V_2$ lower than 0V alternately, wherein $V_2$ is within the range of 5V to 7V and the duration of each application of $+V_2$ is equal to that of each application of $-V_2$. Vs (=Vd) is high enough, possibly ranging from 5V to 7V, to cause band-to-band tunneling hot holes and thereby form electrons/hole pairs in the substrate 100. The electrons are injected in the nitride layer 120 in each of the data storage regions when $+V_2$ is applied to each control gate 140, as shown in FIG. 4A. The electric holes are injected into the nitride layer 120 in each of the data storage regions when $-V_2$ is applied to each control gate 140, as shown in FIG. 4B.

Because the nitride layer 120 in the left data storage region includes positive charges, before the charge amount approaches a balanced value, the amount of the electrons injected during an application of $+V_2$ is more than that of the holes injected during the previous or subsequent application of $-V_2$, so that the threshold voltage of the left data storage region is raised gradually. On the other hand, because the nitride layer 120 in the right data storage region includes negative charges, before the charge amount approaches a balanced value, the amount of the holes injected during an application of $-V_2$ is more than that of the electrons injected during the previous or subsequent application of $+V_2$, so that the threshold voltage of the right data storage region is lowered gradually. After a certain period of time, the charge amounts in the two data storage regions are similar so that the two data storage regions have similar threshold voltages.

In view of the foregoing, for other cells whose two data storage regions are not in the combination of over-erasing and high-Vt states, their data storage regions can also have similar threshold voltages after the reset operation is performed for a certain period of time. In other words, the period of applying the voltages ought to be long enough to have the threshold voltages of all the memory cells converge in a tolerable range. Likewise, in a non-volatile memory with only one data storage region in each cell, all the cells can have similar threshold voltages with the above reset method.

Referring to FIG. 2 that also illustrates an example of the reset method according to the second embodiment of this invention. In this example, the substrate is applied with 0V, all of the bit lines (BL) coupled with the S/D regions is applied with $V_1$ that is higher than 0V and is high enough, possibly ranging from 5V to 7V, to cause band-to-band tunneling hot holes, and all of the word lines (WL) coupled with the control gates are applied with $+V_2$ higher than 0V and $-V_2$ lower than 0V alternately, wherein $V_2$ may range from 5V to 7V and the duration of each application of $+V_2$ is equal to that of each application of $-V_2$. The resulting change in each cell has been described above.

Figure 5:
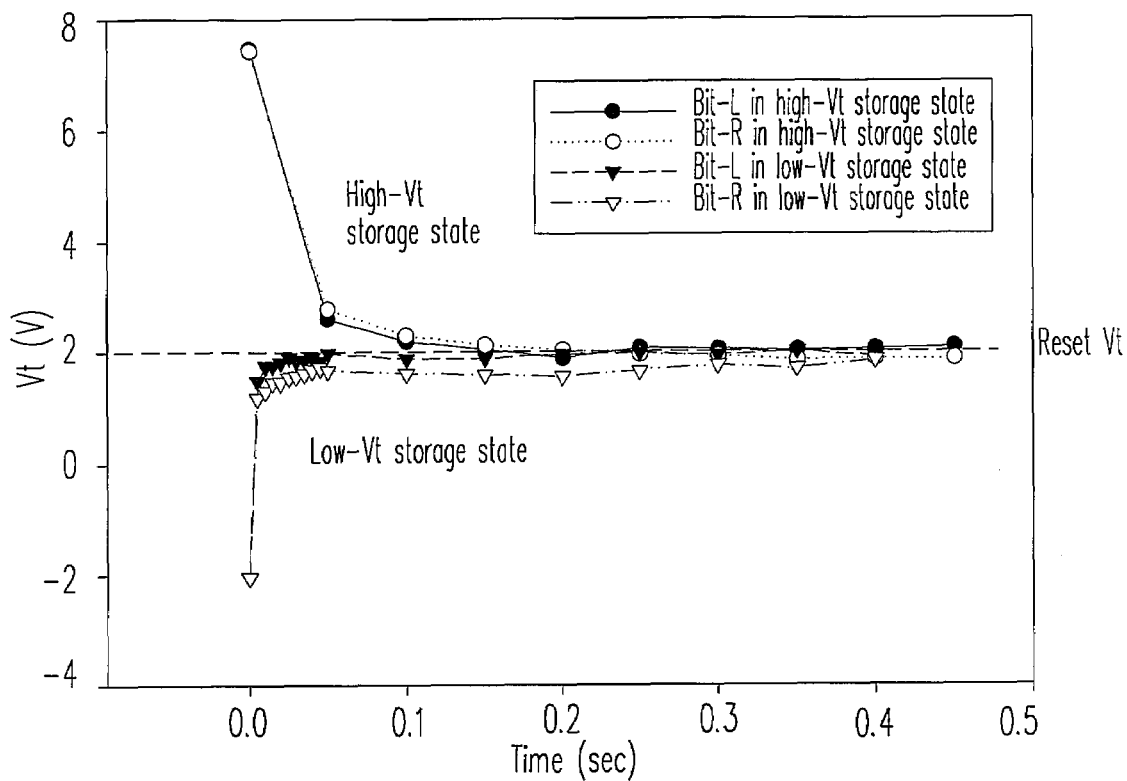
FIG. 5 shows the Vt-variation with time for a left bit or a right bit preset to a high-Vt state or a low-Vt state in an experiment example of the first embodiment of this invention.

FIG. 5 shows the Vt-variation with time for a left bit or a right bit preset to a high-Vt state or a low-Vt state in an experiment example of the first embodiment of this invention. In the experimental example, only one bit of data is stored in each of the left and the right data storage regions, and accordingly the regions are called left bit and right bit, respectively. The substrate and the control gate are applied with 0V while each of the S/D regions is applied with 7V.

As shown in FIG. 5, with an increase in the reset time, the threshold voltage of the over-erased left/right bit and the threshold voltage of the left/right bit preset to the high-Vt state gradually converge toward a specific voltage value this is called a reset Vt. Though a quite long reset time is required to equalize the threshold voltage of each bit and the reset Vt, in practice, the reset time merely needs to have a certain length such that the threshold voltages of all the memory cells converge in a tolerable range.

Figure 6:
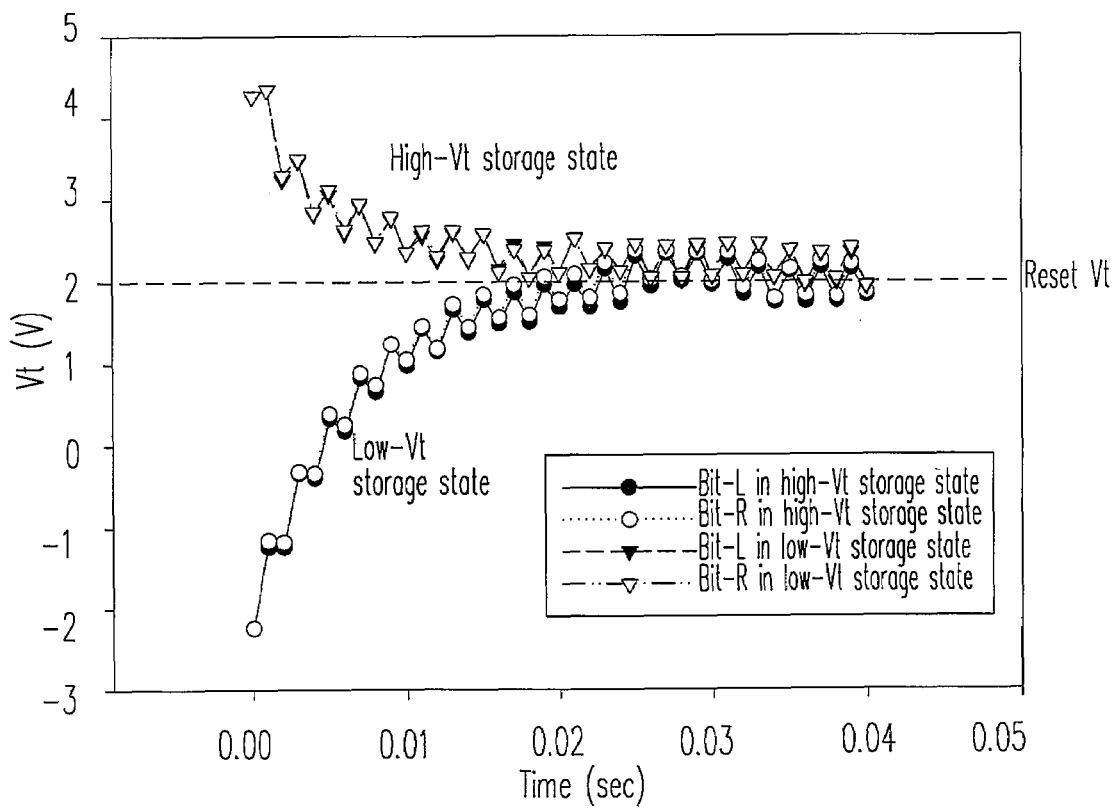
FIG. 6 shows the Vt-variation with time for a left bit or a right bit preset to a high-Vt state or a low-Vt state in an experiment example of the second embodiment of this invention.

FIG. 6 shows the Vt-variation with time for a left bit or a right bit preset to a high-Vt state or a low-Vt state in an experiment example of the second embodiment of this invention. In this experimental example, only one bit of data is stored in each of the left and the right data storage regions, and accordingly the regions are called left bit and right bit, respectively. The substrate is applied with 0V, each of the S/D regions is applied with 5V, and the control gate is applied with +7V and −7V alternatively. The duration of each application of +7V or −7V is 1 ms.

As shown in FIG. 6, with an increase in the reset time, the threshold voltage of the over-erased left/right bit and that of the left/right bit preset to the high-Vt state gradually converge in a certain voltage range in an oscillatory manner. Although the reset method of the second embodiment cannot make the threshold voltages of the bits eventually converge to the reset Vt as in the reset operation of the first embodiment, it makes the threshold voltages converge more quickly to save the reset time.

By utilizing the reset method of this invention, the resulting Vt-distribution is narrower than that obtained in a conventional reset method. Hence, the possibility, of data writing/reading error is reduced in subsequent use of the non-volatile memory.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A reset method of a non-volatile memory comprising a plurality of cells on a substrate of a first conductivity type, each cell comprising a portion of the substrate, a control gate, a charge-storing layer between the portion of the substrate and the control gate, and two S/D regions of a second conductivity type in the portion of the substrate, the method utilizing a double-side bias band-to-band tunneling hot hole (DSB- BTBTHH) effect and comprising:

applying a first voltage to the substrate and a second voltage to both of the S/D regions of each cell, wherein a difference between the first and second voltages is sufficient to cause band-to-band tunneling hot holes; and controlling a gate voltage applied to the control gate of each cell and a period of applying the voltages such that threshold voltages of all the memory cells converge in a tolerable range between a programming threshold voltage at a high threshold voltage (high-Vt) state or a low threshold voltage (low-Vt) state and an erasing threshold voltage at the corresponding low threshold voltage (low-Vt) state or a corresponding high threshold voltage (high-Vt) state.

2. The reset method of claim 1, wherein the charge-storing layer comprises a floating gate, a charge-trapping layer or a nano-crystal layer.

3. The reset method of claim 2, wherein the charge-storing layer comprises a charge-trapping layer or a nano-crystal layer, and each cell comprises two data storage regions adjacent to the two S/D regions, respectively.

4. The reset method of claim 1, wherein the non-volatile memory has a virtual ground array structure.

5. A reset method of a non-volatile memory comprising a plurality of cells on a substrate of a first conductivity type, each cell comprising a portion of the substrate, a control gate, a charge-storing layer between the portion of the substrate and the control gate, and two S/D regions of a second conductivity type in the portion of the substrate, the method utilizing a double-side bias band-to-band tunneling hot hole (DSB-BTBTHH) effect and comprising:

applying a first voltage to the substrate and a second voltage to both of the S/D regions of each cell, wherein a difference between the first and second voltages is sufficient to cause band-to-band tunneling hot holes; and controlling a gate voltage applied to the control gate of each cell and a period of applying the voltages such that threshold voltages of all the memory cells converge in a tolerable range, wherein the gate voltage comprises a third voltage and a fourth voltage that are alternatively applied to the control gate, the third voltage is higher than the first voltage, and the fourth voltage is lower than the first voltage.

6. The reset method of claim 5, wherein a difference between the first and the third voltages is equal to a difference between the first and the fourth voltages, and duration of each application of the third voltage is equal to duration of each application of the fourth voltage.

7. The reset method of claim 6, wherein the first conductivity type is P-type, the second conductivity type is N-type, and the second voltage is higher than the first voltage.

8. The reset method of claim 7, wherein the first voltage is 0V, the second voltage ranges from 5V to 7V, the third voltage ranges from 5V to 7V, and the fourth voltage ranges from −5V to −7V.

9. A reset method of a non-volatile memory comprising a plurality of cells on a substrate of a first conductivity type, each cell comprising a portion of the substrate, a control gate, a charge-storing layer between the portion of the substrate and the control gate, and two S/D regions of a second conductivity type in the portion of the substrate, the method utilizing a double-side bias band-to-band tunneling hot hole (DSB-BTBTHH) effect and comprising:

applying a first voltage to the substrate and a second voltage to both of the S/D regions of each cell, wherein a difference between the first and second voltages is sufficient to cause band-to-band tunneling hot holes; and controlling a gate voltage applied to the control gate of each cell and a period of applying the voltages such that threshold voltages of all the memory cells converge in a tolerable range, wherein the gate voltage is equal to the first voltage.

10. The reset method of claim 9, wherein the first conductivity type is P-type, the second conductivity type is N-type, and the second voltage is higher than the first voltage.

11. The reset method of claim 10, wherein the first voltage is 0V and the second voltage ranges from 5V to 7V.

* * * * *